(12) United States Patent
Signorini

(10) Patent No.: US 6,989,576 B1
(45) Date of Patent: Jan. 24, 2006

(54) MRAM SENSE LAYER ISOLATION

(75) Inventor: Karen Signorini, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/634,212

(22) Filed: Aug. 5, 2003

Related U.S. Application Data

(62) Division of application No. 10/279,139, filed on Oct. 22, 2002, now Pat. No. 6,635,499, which is a continuation of application No. 09/944,956, filed on Aug. 30, 2001, now Pat. No. 6,485,989.

(51) Int. Cl.
 *H01L 29/82* (2006.01)

(52) U.S. Cl. ..................................................... 257/421
(58) Field of Classification Search ................. 257/108, 257/209, 295, 421, 427, E21.665; 438/3; 360/324.2; 365/225.5
See application file for complete search history.

(56) References Cited

U.S. PATENT DOCUMENTS

| 3,553,660 A | 1/1971 | Wolf |
| 3,623,032 A | 11/1971 | Schapira |
| 3,623,035 A | 11/1971 | Kobayashi et al. |
| 3,816,909 A | 6/1974 | Maeda et al. |

(Continued)

FOREIGN PATENT DOCUMENTS

| DE | 198 36 567 A1 | 2/2000 |
| EP | 0 271 017 A2 | 6/1988 |
| EP | 0 271 017 | 6/1988 |
| EP | 0 450 911 | 10/1991 |
| EP | 0 450 911 A2 | 10/1991 |
| EP | 0 776 011 A2 | 5/1997 |
| JP | 2000-30222 | 1/2000 |
| WO | WO 98/20496 | 5/1998 |
| WO | WO 00/19440 | 4/2000 |

OTHER PUBLICATIONS

Honeywell Brochure entitled Pohm et al., "The Architecture of a High Performace Mass Store with GMR Memory Cells," *Nonvolatile Electronics*, pp. 1–3.
Pohm et al., "Experimental and Analytical Properties of 0.2 Micron Wide, Multi–Layer, GmR, Memory Elements," *IEEE Transactions on Magnetics*, vol. 32, No. 5, Sep. 1996, pp. 4645–4647.
Prinz, Gary, "Magnetoelectronics," *Science*, vol. 282, Nov. 27, 1998, pp. 1660–1663.
Wang, Zhi G. et al., "Feasibility of Ultra–Dense Spin–Tunneling Random Access Memory," *IEEE Transactions on Magnetics*, vol. 33, No. 6, Nov. 1997, pp. 4498–4512.
Razavi et al., "Design Techniques for High–Speed, High–Resolution Comparators," *IEEE Journal of Solid State Circuit*, vol. 27, No. 12, Dec. 1992.

*Primary Examiner*—Carl Whitehead, Jr.
*Assistant Examiner*—Jennifer M. Dolan
(74) *Attorney, Agent, or Firm*—Knobbe Martens Olson & Bear, LLP

(57) ABSTRACT

A process for forming an MRAM element. The process comprises patterning a globally deposited sense layer and then forming a spacer about the patterned sense layer so as to cover the lateral edges of the patterned sense layer. Subsequently, a globally deposited tunnel layer and fixed layer are patterned so as to define the MRAM element. Preferably, the pinned layer is patterned such that the outer lateral edges of the pinned layer is displaced in a direction parallel to the substrate from the lateral edges of the patterned sensed layer thereby reducing coupling effects between the two layers. Moreover, the use of a spacer during the process further inhibits shorting between the sense layer and the pinned layer during patterning of the pinned layer.

8 Claims, 3 Drawing Sheets

U.S. PATENT DOCUMENTS

| | | |
|---|---|---|
| 3,947,831 A | 3/1976 | Kobayashi et al. |
| 4,044,330 A | 8/1977 | Johnson et al. |
| 4,060,794 A | 11/1977 | Feldman et al. |
| 4,065,742 A | 12/1977 | Kendall et al. |
| 4,158,891 A | 6/1979 | Fisher |
| 4,455,626 A | 6/1984 | Lutes |
| 4,666,554 A | 5/1987 | De Wilde et al. |
| 4,731,757 A | 3/1988 | Daughton et al. |
| 4,780,848 A | 10/1988 | Daughton et al. |
| 4,801,883 A | 1/1989 | Muller et al. |
| 4,849,695 A | 7/1989 | Muller et al. |
| 4,897,288 A | 1/1990 | Jenson |
| 4,918,655 A | 4/1990 | Daughton |
| 4,945,397 A | 7/1990 | Schuetz |
| 5,039,655 A | 8/1991 | Pisharody |
| 5,060,193 A | 10/1991 | Daughton et al. |
| 5,064,499 A | 11/1991 | Fryer |
| 5,140,549 A | 8/1992 | Fryer |
| 5,424,236 A | 6/1995 | Daughton et al. |
| 5,496,759 A | 3/1996 | Yue et al. |
| 5,547,599 A | 8/1996 | Wolfrey et al. |
| 5,569,617 A | 10/1996 | Yeh et al. |
| 5,587,943 A | 12/1996 | Torok et al. |
| 5,650,958 A * | 7/1997 | Gallagher et al. .......... 365/173 |
| 5,701,222 A | 12/1997 | Gill et al. |
| 5,726,498 A | 3/1998 | Licata et al. |
| 5,741,435 A | 4/1998 | Beetz, Jr. et al. |
| 5,756,366 A | 5/1998 | Berg et al. |
| 5,795,823 A | 8/1998 | Avanzino et al. |
| 5,861,328 A | 1/1999 | Tehrani et al. |
| 5,926,394 A | 7/1999 | Nguyen et al. |
| 5,956,267 A | 9/1999 | Hurst et al. |
| 5,982,658 A | 11/1999 | Berg et al. |
| 6,028,786 A | 2/2000 | Nishimura |
| 6,048,739 A | 4/2000 | Hurst et al. |
| 6,136,705 A | 10/2000 | Blair |
| 6,153,443 A | 11/2000 | Durlam et al. |
| 6,174,737 B1 | 1/2001 | Durlam et al. |
| 6,211,559 B1 | 4/2001 | Zhu et al. |
| 6,218,302 B1 | 4/2001 | Braeckelmann et al. |
| 6,233,172 B1 * | 5/2001 | Chen et al. .................. 365/173 |
| 6,242,770 B1 * | 6/2001 | Bronner et al. ............. 257/295 |
| 6,325,900 B1 * | 12/2001 | Komuro et al. .......... 204/192.2 |
| 6,338,899 B1 | 1/2002 | Fukuzawa et al. |
| 6,358,756 B1 | 3/2002 | Sandhu et al. |
| 6,379,978 B2 | 4/2002 | Goebel et al. |
| 6,391,658 B1 | 5/2002 | Gates et al. |
| 6,392,922 B1 | 5/2002 | Liu et al. |
| 6,440,753 B1 | 8/2002 | Ning et al. |
| 6,485,989 B1 | 11/2002 | Signorini |
| 6,555,889 B2 * | 4/2003 | Hiramoto et al. ........... 257/421 |
| 6,624,987 B1 * | 9/2003 | Hayashi et al. .......... 360/324.2 |
| 6,627,913 B2 | 9/2003 | Chen |
| 2002/0041514 A1 | 4/2002 | Scheler et al. |

* cited by examiner

MRAM SENSE LAYER ISOLATION

RELATED APPLICATIONS

This application is a divisional application of U.S. application Ser. No. 10/279,139, filed Oct. 22, 2002 now U.S. Pat. No. 6,635,499 which was a continuation application of U.S. application Ser. No. 09/944,956, filed Aug. 30, 2001 now U.S. Pat. No. 6,485,989, entitled "MRAM SENSE LAYER ISOLATION" and is hereby incorporated herein by reference.

BACKGROUND OF THE INVENTION

1. Field of the Invention

The present invention relates to semiconductor processing technology and, in particular, concerns a magnetoresistive random access memory (MRAM) device and fabrication process for an element.

2. Description of the Related Art

MRAM is a developing technology that offers the advantages of non-volatility and high density fabrication. MRAM structures employ the spin property of electrons within layers of metallic-based magnetic material that have a physical property known as magnetoresistance (MR) to read the memory storage logic states. Binary logic states typically require sensing of a resistance differential to distinguish between "on" and "off" states. If a particular material has a high resistance, the ability of electrons to flow through the material is inhibited and, conversely, a low resistive material tends to allow a higher degree of current flow. MRAM structures take advantage of this resistivity concept by manipulating the alignment of magnetic fields within metallic layers of material to increase or decrease the resistance.

Moreover, current flow through a conductive trace induces a magnetic field. In the presence of an orthogonal external magnetic field, the spin direction of a stationary MR electron may be altered in one of two directions; either "upspin", parallel to the magnetic field or "downspin", antiparallel to the magnetic field. Thus, by the application of a magnetic field, the resistivity of a magnetoresistive material can be altered.

MRAM devices typically consist of a pinned (spin stationary) layer and a sense (spin programmable) layer with a tunneling layer interposed between the pinned layer and the sense layer. Typically, the magnetoresistive structure has electrodes that are positioned adjacent the sense layer and also adjacent the pinned layer such that the application of a current to the pinned and sense layer can change the magnetoresistive qualities of the MRAM element thereby altering its resistance. In this way, logic states can be programmed into an MRAM element and, by subsequent reading of the resistance of the MRAM element via the conductive traces, the logic state can be subsequently retrieved.

MRAM structures are typically formed using known patterning and etching techniques used to manufacture other semiconductor memory devices, such as DRAMs. For example, the typical MRAM element or array is generally formed on a substrate. Sequential layers of magnetic material are deposited on the substrate and are then patterned and etched so as to define the MRAM element. For example, in one common MRAM structure, a magnetic pinned layer is deposited globally over a region of the substrate followed by the global deposition of the tunneling layer and then followed by the global deposition of the sense layer. Patterning and etching or ion milling techniques are then used to selectively remove portions of the globally deposited layers so as to define an MRAM element.

Several difficulties occur during the manufacturing process which reduce the yield of usable MRAM elements. For example, the sense layer and tunneling layer are often patterned prior to the patterning of the underlying pinned layer. During subsequent patterning of the underlying pinned layer, the sidewalls of the patterned sense layer can be exposed and material from the underlying pinned layer can sputter up during the pinned layer patterning thereby resulting in the two magnetic layers being shorted together. With the two magnetic layers shorted together, the MRAM element is typically unable to record two separate binary states and be used for memory storage.

This particular problem becomes more exacerbated when MRAM devices of higher density are being made. In particular, higher density devices typically have much smaller features, thereby resulting in the pinned layer and the sense layer being positioned more closely together resulting in shorted MRAM elements being more likely.

A further difficulty with the typical MRAM fabrication process is that once the sense layer and tunneling layer have been patterned, it is often very difficult to pattern the underlying pinned layer to have dimensions other than the previously patterned sense layer. Consequently, in the typical MRAM element, the outer lateral edges of the patterned sense layer and the underlying patterned pinned layer are generally located proximate to each other. As is understood, the magnetic field of the underlying pinned layer is substantially stronger than the magnetic field of the sense layer. Magnetic flux emanating from the pinned layer can alter or otherwise effect the magnetic field of the sense layer. Hence, the magnetic field of the pinned layer can result in variations in the magnetic field of the sense layer other than what has been programmed. Consequently, the data that is stored in the MRAM element can then be inadvertently altered or changed as a result of magnetic coupling.

It is also understood that magnetic flux is more concentrated at the lateral edges of the magnetic pinned layer. Consequently, when the lateral edges of the pinned layer are location proximate the lateral edges of the sense layer, the potential of the pinned layer adversely affecting the sense layer is increased. As MRAM elements are being made increasingly smaller, the proximity of the edges to each other results in an increase in magnetic coupling between the pinned layer and the sense layer.

From the foregoing, it will be appreciated that there is a need for a process of fabricating MRAM elements such that the yield of the MRAM element can be improved and also such that magnetic coupling between the various layers of the MRAM element can be reduced.

SUMMARY OF THE INVENTION

The aforementioned needs are satisfied by the present invention which, in one aspect, comprises a process for fabricating MRAM element. In this aspect, the process comprises globally depositing a first magnetic layer on a region of a substrate, globally depositing a tunnel layer on the first magnetic layer, and globally depositing a second magnetic layer on the tunneling layer. The process further comprises patterning the second magnetic layer so as to define a patterned second magnetic layer of the MRAM element. The process then comprises forming an isolation structure around the lateral edges of the patterned second magnetic layer. Subsequently, the process comprises patterning the underlying global first magnetic layer so as to define a patterned second magnetic layer. In one particular implementation the outer lateral edges of the of the patterned first magnetic layer coincide with the outer lateral edges of the isolation element such that the outer lateral edges of the patterned first magnetic layer are displaced from the outer lateral edges of the second magnetic layer. In one implementation, the first magnetic layer comprises a pinned layer and the second magnetic layer comprises a sense layer.

By laterally displacing the outer lateral edges of the patterned pinned layer from the outer lateral edges of the sense layer, coupling between the pinned and sense layers of the MRAM element can be reduced. Moreover, the presence of the isolation element during patterning of the pinned layer, reduces the likelihood that the pinned layer and the sense layer will become shorted during the patterning process.

In another aspect, the present invention comprises an MRAM element having a substrate, a first magnetic layer of a first lateral dimension formed on the substrate, a tunnel layer positioned on the first magnetic layer; and a second magnetic layer positioned on the tunneling layer having a second lateral dimension that is less than the first lateral dimension such that the lateral edges of the first magnetic layer and the second magnetic layer are offset from each other. In one particular embodiment, the MRAM element further comprises an isolation layer that is positioned about the outer lateral edges of the second magnetic layer so as to inhibit contact between the first magnetic first magnetic layer and the second magnetic layer. Preferably, the first and second magnetic layers are selected such that the application of a magnetic field changes the net magnetization of the element so that the resistivity of the element changes between a first state and a second state thereby enabling the element to be used as a data storage element. In one implementation, the first magnetic layer comprises a pinned layer with a fixed magnetic field and the second magnetic layer comprises a sense layer that has a changeable magnetic field such that the application of an external magnetic field can alter the overall resistivity of the element.

From the foregoing, it will be appreciated that the process and apparatus of the present invention inhibits shorting of the sense and pinned layers of the MRAM structure during fabrication and also during subsequent use and further reduces the likelihood of coupling between the pinned and sense layer during operation. These and other objects and advantages of the present invention will become more apparent from the following description taken in conjunction with the accompanying drawings.

DETAILED DESCRIPTION OF THE PREFERRED EMBODIMENTS

Figure 1:
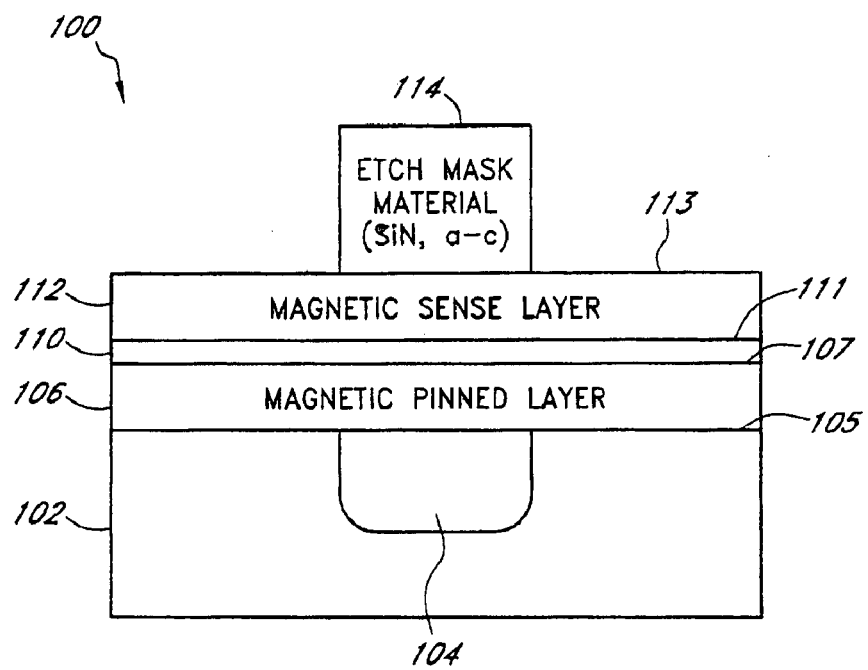
FIG. 1 is a schematic illustration of a partially formed MRAM element having a globally deposited pinned layer, a globally deposited tunnel layer, and a globally deposited sense layer.

Reference will now be made to the drawings wherein like numerals refer to like parts throughout. Referring initially to FIG. 1, a partially constructed MRAM element 100 is shown. The substrate 100 is typically comprised of a layer of insulated material, such as BPSG, or can further comprise a semiconductor material such as silicon. The substrate 102 has often been patterned to form an opening into which a conductor 104 has been deposited. In one particular implementation, the conductor 104 in the substrate 102 is comprised of a copper conductor that is formed into the opening in the substrate 102 using known damascene processing techniques.

As is further illustrated in FIG. 1, a magnetic pinned layer 106 is globally deposited over an upper surface 105 of a region of the substrate 102. In one implementation, the magnetic pinned layer 106 is comprised of a layer of nickel iron (NiFe) or nickel iron cobalt (NiFeCo) that is approximately 30–150 Å thick and is globally deposited over the entire upper surface 105 of a region of the substrate 102 using known deposition techniques, such as CVD, plasma enhanced CVD, sputter deposition, physical vapor deposition or the like.

Preferably, the magnetic pinned layer 106 is magnetized in a first fixed direction and acts as a first reference point for the net directional magnetization vectors of the MRAM element. Further, because the magnetic pinned layer 106 is globally deposited over the upper surface 105 of a region of the substrate, the magnetic pinned layer is electrically connected to the conductor 104 formed in the substrate 102.

As is also illustrated in FIG. 1, a tunnel oxide layer 110 is globally deposited on an upper surface 107 of the magnetic pinned layer 106. The tunnel oxide layer, in one implementation, is comprised of a thin aluminum material, such as $Al_2O_3$. In one implementation, the tunnel oxide layer is approximately 10–15 Å thick and is deposited using known deposition techniques, such as the deposition techniques. In one implementation, a layer of Aluminum is deposited using known deposition techniques and the layer is subsequently oxidized using known oxidation techniques.

As is further illustrated in FIG. 1, a magnetic sense layer 112 is globally deposited on an upper surface 111 of the tunneling oxide layer 110. The magnetic sense layer 112 is preferably formed of a material that can be magnetized in one of two directions so as to change the net resistivity of the MRAM element to thereby define two logic states in a known manner. In one implementation, the magnetic sense layer 112 is formed of a layer of nickel iron cobalt (NiFeCo) or nickel iron (NiFe) that is approximately 30–150 Å thick and is deposited in any of the above-mentioned deposition techniques. FIG. 1 further illustrates that an etch mask material has been deposited on an upper surface 113 of the magnetic sense layer 112 and has been subsequently patterned so as to define the lateral dimensions of a portion of the MRAM element 100 in the manner that will be described in greater detail below. Preferably, the etch mask material is made of a material, such as silicon nitride (SiN), $SiO_2$ or a-carbon. This material is preferably non-conducting so as to form an insulator insulating the magnetic sense layer 112 and can preferably be subsequently patterned so as to provide electrical access to the sense layer in a known manner. However, this hardmask material can also be non-isolating as long as the underlying magnetic sense and pinned layers can be etched selective to this hardmask. Potential non-isolating candidates are Ta, TaN, DARC and TiN.

Figure 2:
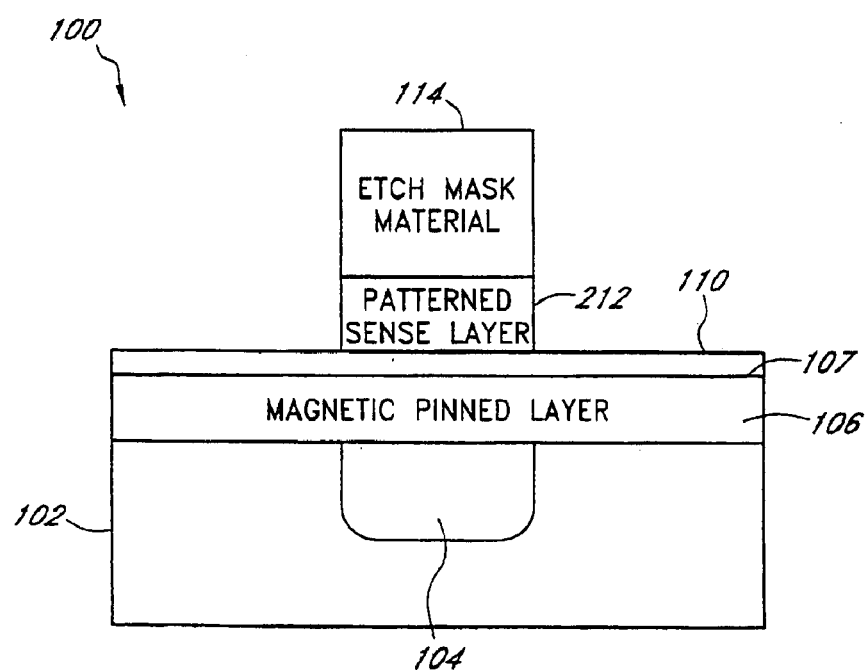
FIG. 2 is a schematic illustration of the MRAM element of FIG. 1 after the globally deposited sense layer has been patterned.

As is illustrated in FIG. 2, the magnetic sense layer 112 is preferably patterned so as to define a patterned sense layer 212. Preferably, the portions of the magnetic sense layer 112 that are not positioned under the etch mass 114 are removed such that the upper surface 111 of the globally deposited tunneling layer 110 is exposed. As is illustrated in FIG. 2, since the globally deposited tunneling layer 110 remains on the upper surface 107 of the magnetic pinned layer 106 following the patterning of the globally deposited magnetic sense layer 112 into the patterned sense layer 212, physical or electrical contact between the patterned sense layer 212 and the magnetic pinned layer 106 is inhibited.

Figure 3:
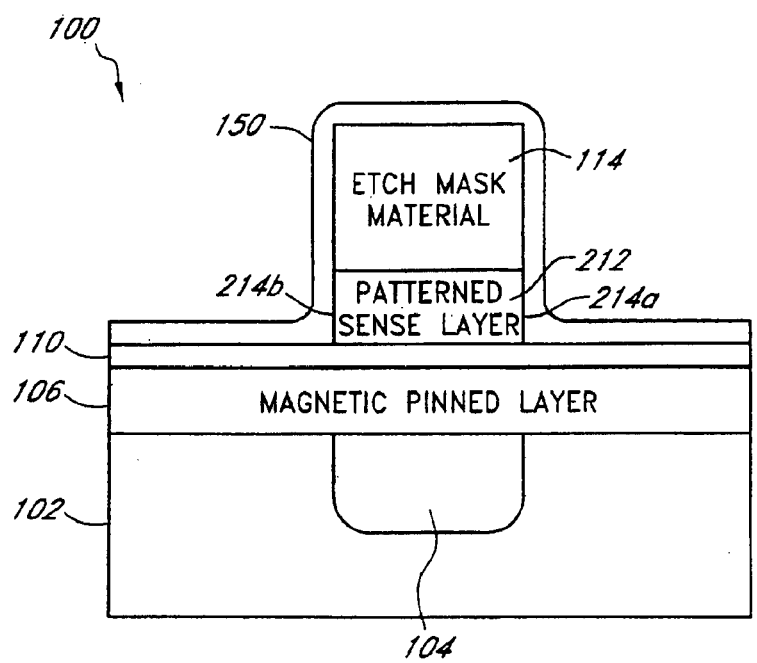
FIG. 3 is a schematic illustration of the MRAM element of FIG. 2, wherein an isolation layer has been deposited so as to protect the patterned sensed layer.

As is illustrated in FIG. 3, following the formation of the patterned sense layer 212, a thin non-conducting material is deposited globally over the global tunneling oxide layer 110, the patterned sense layer 212 and the etch mask 114. As is illustrated in FIG. 3, the non-conducting layer 150 is preferably globally deposited over the global tunnel oxide layer 110 and the etch mass layer 114. Moreover, as is illustrated in FIG. 3, the non-conducting layer 150 is preferably deposited conformally so as to cover the outer lateral edges 214a, 214b of the patterned sense layer 212. In one embodiment, the non-conducting layer 150 is comprised of a material such as a-carbon, SiC, or silicon nitride and it is deposited using known deposition techniques to a thickness of approximately 300 Å to 500 Å.

Figure 4:
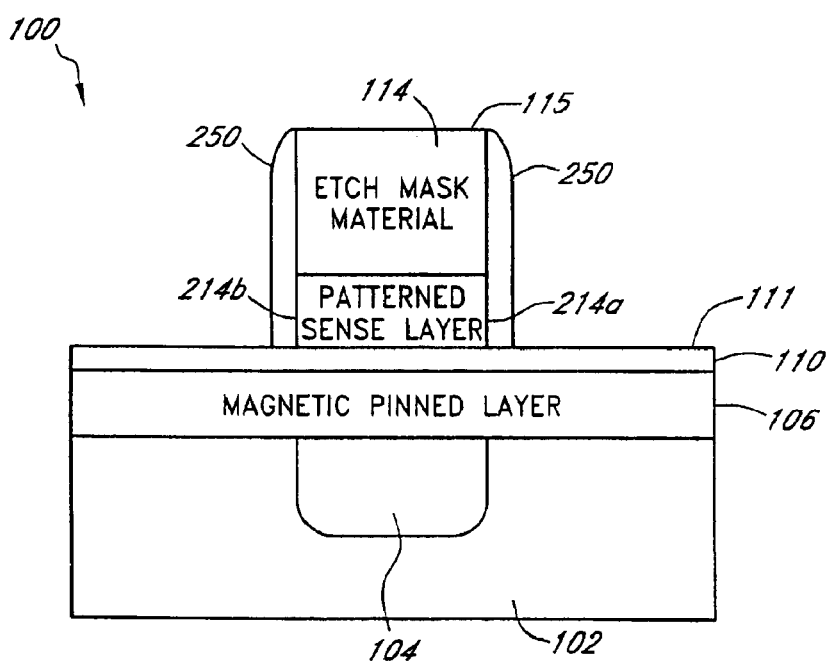
FIG. 4 is a schematic illustration of the MRAM element of FIG. 3 after the isolation layer has been patterned so as to define an isolation structure.

As is illustrated in FIG. 4, the non-conducting layer 150 is subsequently dry etched so as to remove portions of the insulating layer that are positioned on the upper surface 11 of the global tunneling oxide layer 110 and on the upper surface 115 of the etch mask 114 such that the non-conducting layer 150 has been transformed into a spacer structure 250. As is illustrated in FIG. 4, the dry etch process has preferably continued until the upper surface 111 of the global tunnel oxide layer 110 has been exposed. Moreover, the spacer structure 250 is preferably positioned so as to cover the outer lateral edges 214a, 214b of the patterned sense layer 212.

Figure 5:
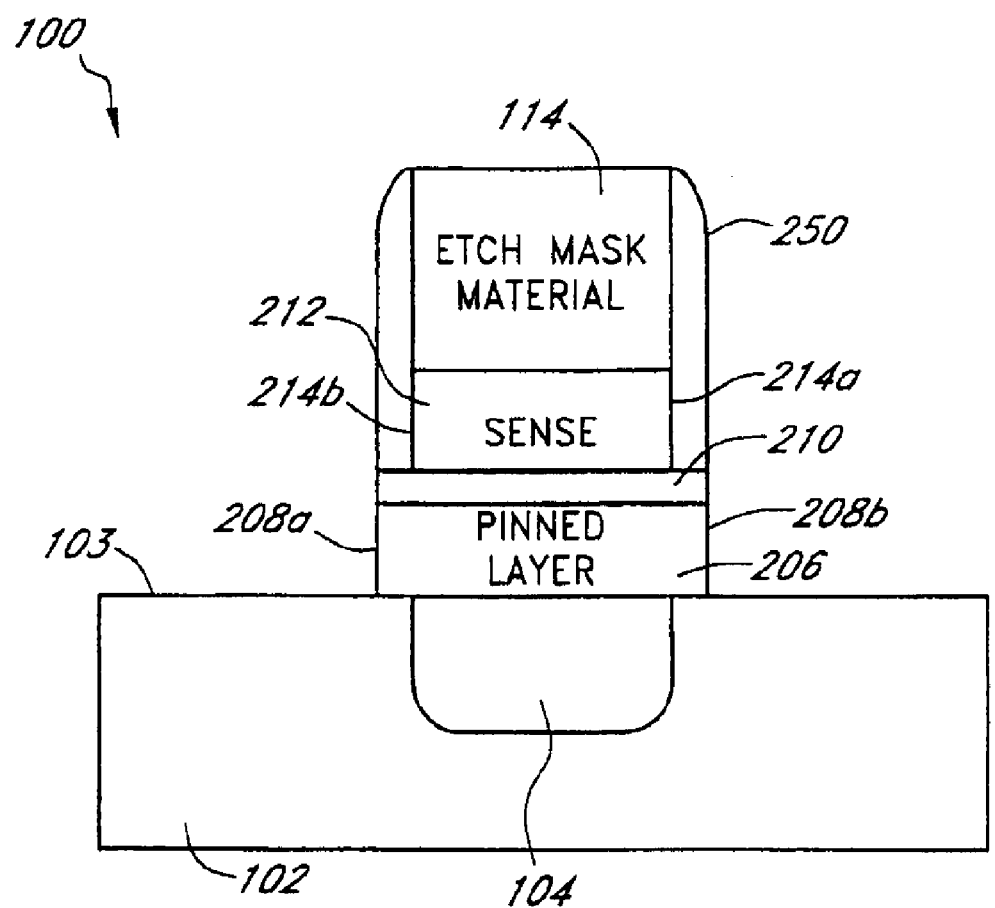
FIG. 5 is a schematic illustration of the MRAM element of FIG. 4 after the tunnel layer and the magnetic pinned layer have been patterned.

As is further illustrated in FIG. 5, following the formation of the spacer 250, the global tunnel oxide layer 110 and the magnetic pinned layer 106 is then patterned, preferably using a dry etch or ion milling process, so as to define a patterned tunneled oxide layer and a tunneled pinned layer 206 in the manner illustrated in FIG. 5. As is further illustrated in FIG. 5, during the patterning of the tunnel oxide layer 110 and the pinned layer 106, the outer lateral edges 214a, 214b of the patterned sense layer 212 is preferably covered by the spacer structure 250 such that the pinned layer 106 will not sputter up and make physical contact with the patterned sense layer 212. In this way, the likelihood of the patterned sense layer 212 and the formed patterned pinned layer 206 being physically connected and thereby electrically shorted is reduced.

Moreover, the spacer structure 250 acts as a mask structure during the patterning of the tunnel oxide layer 110 and the pinned layer 106 such that the outer lateral edges of the pinned layer 208a, 208b are laterally offset from the outer lateral edges 214a, 214b of the patterned sense layer 212. In one particular implementation, the outer lateral edges 208a, 208b of the pinned layer 206, is displaced in a direction parallel to the upper surface 103 of the substrate 102 by a distance of approximately 300 Å to 500 Å. Because the outer lateral edges 206a, 206b of the patterned pinned layer 206 is laterally displaced from the outer lateral edges 214a, 214b of the patterned sense layer 212, the likelihood of magnetic coupling between the patterned sense layer 212 and the patterned pinned layer 206 is reduced. Hence, the use of the spacer 250 allows for the formation of a larger pinned layer which minimizes the effect of the magnetic field in the pinned layer on the sense layer at the edge of the device. As discussed above, the stronger magnetic field in the pinned layer 206 can result in a change in the magnetic state of the sense layer 212 which can result in data stored therein being corrupted.

Hence, from the foregoing, it will be appreciated that the process for forming an MRAM element described above allows for formation of MRAM elements with greater yield as fewer of the elements are damaged as a result of physical contact between the various magnetized layers. Moreover, coupling effects between the pinned layer and the sensed layer can further be reduced as a result of the offset between the lateral edges of the patterned pinned layer and the patterned sense layer.

Although the foregoing description exemplifies a range of preferred embodiments, it should be understood that various omissions, substitutions and changes in the form of the detail of the apparatus, system and method as illustrated as well as the uses thereof may be made by those skilled in the art, without departing from the spirit of the present invention. Consequently, the scope of the present invention should not be limited to the disclosed and illustrated embodiments, but should be defined by the appended claims.

What is claimed is:

1. A magnetic memory device formed on a substrate comprising:
   a pinned layer magnetized in a first direction and patterned to a first width;
   a sense layer that can be selectively magnetized in the first direction or a second direction that is opposite the first direction so as to change the net resistivity of the magnetic memory device, and wherein the sense layer is patterned to a second width that is at least less than the first width to thereby reduce magnetic coupling between the pinned and sensed layers;
   a spacer that is positioned about the outer lateral edge of the sense layer, wherein the spacer is interposed between the outer lateral edges of the sense layer and the pinned layer, wherein the spacer is formed of a non-conducting material selected from the group consisting of silicon nitride (SiN), SiC, and a-carbon.

2. The device of claim 1, wherein the substrate comprises a conductor formed therein.

3. The device of claim 2, wherein the pinned layer is formed above the substrate so as to overlie the conductor.

4. The device of claim 3, wherein the magnetic memory device further comprises a tunnel layer that is formed so as to overlie the pinned layer and be interposed between the pinned layer and the sense layer.

5. The device of claim 4, wherein the sense layer is formed so as to overlie the tunnel layer.

6. The device of claim 1, wherein the sense layer comprises a variable magnetic field that can be varied by the application of an external field to thereby change the combined magnetic characteristics of the pinned and sense magnetic layers.

7. A magnetic memory device formed on a substrate comprising:
   a pinned layer magnetized in a first direction and patterned to a first width;
   a sense layer that can be selectively magnetized in the first direction or a second direction that is opposite the first direction so as to change the net resistivity of the magnetic memory device, and wherein the sense layer is patterned to a second width that is at least less than the first width to thereby reduce magnetic coupling between the pinned and sensed layers;

a spacer that is positioned about the outer lateral edge of the sense layer, wherein the spacer is interposed between the outer lateral edges of the sense layer and the pinned layer, wherein the spacer is formed of a non-conducting material selected from the group consisting of silicon nitride (SiN), SiC, and a-carbon, wherein the pinned layer is formed of nickel iron (NiFe), the tunnel layer is formed of aluminum oxide ($Al_2O_3$) and the sense layer is formed of nickel iron cobalt (NiFeCo).

8. A magnetic memory device comprising:

a substrate having an opening formed therein;

a conductor formed within the opening of the substrate;

a pinned layer formed above the substrate so as to overlie the conductor, wherein the pinned layer is magnetized in a first direction, and wherein the pinned layer is patterned to a first width;

a tunnel layer formed above the pinned layer so as to overlie the pinned layer, wherein the tunnel layer is patterned to the first width;

a sense layer formed above the tunnel layer so as to overlie the tunnel layer, wherein the sense layer can be selectively magnetized in the first direction or a second direction that is opposite the first direction so as to change the net resistivity of the magnetic memory device, and wherein the sense layer is patterned to a second width that is at least less than the first width to thereby reduce magnetic coupling between the pinned and sense layers; and a spacer that is positioned about the outer lateral edges of the sense layer, wherein the spacer is formed of a material selected from the group consisting of silicon nitride, silicon carbide, and amorphous carbon.

* * * * *